United States Patent
Tran

(10) Patent No.: US 6,732,320 B1
(45) Date of Patent: May 4, 2004

(54) METHOD AND SYSTEM FOR IMPROVED ERROR CORRECTION IN OPTICAL MEDIA DATA PROCESSING

(75) Inventor: Paul Phuc Thanh Tran, Milpitas, CA (US)

(73) Assignee: ProMOS Technologies Inc., Hsing-Chu (TW)

( * ) Notice: Subject to any disclaimer, the term of this patent is extended or adjusted under 35 U.S.C. 154(b) by 0 days.

(21) Appl. No.: 09/560,867

(22) Filed: Apr. 28, 2000

(51) Int. Cl.$^7$ .................. H03M 13/29; H03M 13/45; G11B 20/18
(52) U.S. Cl. ................ 714/765; 714/755; 714/769; 714/809
(58) Field of Search ................ 714/755, 756, 714/809, 769, 765

(56) References Cited

U.S. PATENT DOCUMENTS

| | | | |
|---|---|---|---|
| 4,472,686 A * | 9/1984 | Nishimura et al. | 341/53 |
| 4,477,903 A | 10/1984 | Schouhamer Immink | 371/37 |
| 4,562,577 A | 12/1985 | Glover et al. | 371/38 |
| 4,564,945 A | 1/1986 | Glover et al. | 371/38 |
| 4,593,395 A | 6/1986 | Schouhamer Immink | |
| 4,633,471 A | 12/1986 | Perera et al. | 371/38 |
| 4,675,870 A * | 6/1987 | Baggen | 714/780 |
| 4,683,572 A * | 7/1987 | Baggen et al. | 714/756 |
| 4,698,810 A | 10/1987 | Fukuda et al. | 371/38 |
| 4,827,489 A * | 5/1989 | Doi et al. | 375/34 |
| 4,849,975 A | 7/1989 | Patel | 371/38 |
| 4,968,985 A * | 11/1990 | Riggle et al. | 341/106 |
| 5,068,858 A | 11/1991 | Blaum et al. | 371/41 |
| 5,077,721 A * | 12/1991 | Sako et al. | 369/59.26 |
| 5,107,503 A | 4/1992 | Riggle et al. | 371/37.1 |
| 5,198,813 A * | 3/1993 | Isozaki | 341/59 |
| 5,216,677 A * | 6/1993 | Takagi et al. | 714/765 |
| 5,280,488 A | 1/1994 | Glover et al. | 371/37.1 |
| 5,321,703 A | 6/1994 | Weng | 371/36 |
| 5,373,513 A | 12/1994 | Howe et al. | 371/42 |
| 5,379,305 A | 1/1995 | Weng | 371/41 |
| 5,384,786 A | 1/1995 | Dudley et al. | 371/37.1 |
| 5,467,360 A | 11/1995 | Lokhoff | 371/37.4 |
| 5,592,497 A | 1/1997 | Lokhoff | 371/37.4 |
| 5,638,063 A * | 6/1997 | Ino | 341/50 |
| 5,638,064 A * | 6/1997 | Mori et al. | 341/58 |
| 5,644,695 A | 7/1997 | Blaum et al. | 395/182.04 |
| 5,671,237 A | 9/1997 | Zook | 371/37.4 |
| 5,701,310 A * | 12/1997 | Deguchi et al. | 714/746 |
| 5,706,396 A | 1/1998 | Schroder et al. | 395/2.37 |
| 5,724,368 A | 3/1998 | Zook | 371/37.7 |
| 5,732,093 A * | 3/1998 | Huang | 714/765 |
| 5,892,745 A | 4/1999 | Belser | 369/54 |
| 5,986,592 A * | 11/1999 | Nakagawa et al. | 341/94 |
| 5,991,911 A | 11/1999 | Zook | 714/758 |
| 5,996,105 A | 11/1999 | Zook | 714/755 |
| 6,038,274 A * | 3/2000 | Ribeiro Filho et al. | 375/365 |
| 6,111,833 A * | 8/2000 | Nakagawa et al. | 369/59.23 |
| 6,212,155 B1 * | 4/2001 | Hasebe | 369/124.13 |
| 6,313,764 B1 * | 11/2001 | Nakagawa et al. | 341/59 |
| 6,340,938 B1 * | 1/2002 | Nakagawa | 341/58 |
| 6,362,754 B1 * | 3/2002 | Van Dijk et al. | 341/59 |
| 6,392,569 B1 * | 5/2002 | Mimachi et al. | 341/58 |
| 6,396,787 B1 * | 5/2002 | Lee et al. | 369/59.18 |
| 6,483,882 B1 * | 11/2002 | O'Dea | 375/343 |

* cited by examiner

*Primary Examiner*—Stephen M. Baker
(74) *Attorney, Agent, or Firm*—Sawyer Law Group LLP

(57) ABSTRACT

The present invention provides a method and system for error correction in optical media data processing. The method includes demodulating a data using a conversion table; marking errors which occur during the demodulation; utilizing estimated values for the marked errors; and performing error correction. The method and system marks errors which occur during demodulation. A logic array is used to obtain estimated values for the marked errors. The marking of errors and the use of values from the logic array for the marked errors increases the probability of the C1 and C2 correction processes being able to correct the errors. Fewer "not correctable" data results. This increases the integrity of the read data.

10 Claims, 6 Drawing Sheets

| # | data bits | channel bits | # | data bits | channel bits |
|---|---|---|---|---|---|
| 0 | 00000000 | 01001000100000 | 64 | 01000000 | 01001000100100 |
| 1 | 00000001 | 10000100000000 | 65 | 01000001 | 10000100100100 |
| 2 | 00000010 | 10010000000000 | 66 | 01000010 | 10010000100100 |
| 3 | 00000011 | 10001000100000 | 67 | 01000011 | 10001000100100 |
| 4 | 00000100 | 01000100000000 | 68 | 01000100 | 01000100100100 |
| 5 | 00000101 | 00000100010000 | 69 | 01000101 | 00000000100100 |
| 6 | 00000110 | 00010000100000 | 70 | 01000110 | 00010000100100 |
| 7 | 00000111 | 00100100000000 | 71 | 01000111 | 00100100100100 |
| 8 | 00001000 | 01001001000000 | 72 | 01001000 | 01001001000100 |
| 9 | 00001001 | 10000001000000 | 73 | 01001001 | 10000001000100 |
| 10 | 00001010 | 10010001000000 | 74 | 01001010 | 10010001000100 |
| 11 | 00001011 | 10001001000000 | 75 | 01001011 | 10001001000100 |
| 12 | 00001100 | 01000001000000 | 76 | 01001100 | 01000001000100 |
| 13 | 00001101 | 00000001000000 | 77 | 01001101 | 00000001000100 |
| 14 | 00001110 | 00010001000000 | 78 | 01001110 | 00010001000100 |
| 15 | 00001111 | 00100001000000 | 79 | 01001111 | 00100001000100 |
| 16 | 00010000 | 10000000100000 | 80 | 01010000 | 10000000100100 |
| 17 | 00010001 | 10000010000000 | 81 | 01010001 | 10000010000100 |
| 18 | 00010010 | 10010010000000 | 82 | 01010010 | 10010010000100 |
| 19 | 00010011 | 00100000100000 | 83 | 01010011 | 00100000100100 |
| 20 | 00010100 | 01000010000000 | 84 | 01010100 | 01000010000100 |
| 21 | 00010101 | 00000010000000 | 85 | 01010101 | 00000010000100 |
| 22 | 00010110 | 00010010000000 | 86 | 01010110 | 00010010000100 |
| 23 | 00010111 | 00100010000000 | 87 | 01010111 | 00100010000100 |
| 24 | 00011000 | 01001000010000 | 88 | 01011000 | 01001000000100 |
| 25 | 00011001 | 10000000010000 | 89 | 01011001 | 10000000000100 |
| 26 | 00011010 | 10010000010000 | 90 | 01011010 | 10010000000100 |
| 27 | 00011011 | 10001000010000 | 91 | 01011011 | 10001000000100 |
| 28 | 00011100 | 01000000010000 | 92 | 01011100 | 01000000000100 |
| 29 | 00011101 | 00000000010000 | 93 | 01011101 | 00000000000100 |
| 30 | 00011110 | 00010000010000 | 94 | 01011110 | 00010000000100 |
| 31 | 00011111 | 00100000010000 | 95 | 01011111 | 00100000000100 |
| 32 | 00100000 | 00000000100000 | 96 | 01100000 | 01001000100010 |
| 33 | 00100001 | 10000100001000 | 97 | 01100001 | 10000100100010 |
| 34 | 00100010 | 00001000100000 | 98 | 01100010 | 10010000100010 |
| 35 | 00100011 | 00100100100000 | 99 | 01100011 | 10001000100010 |
| 36 | 00100100 | 01000100001000 | 100 | 01100100 | 01000100100010 |
| 37 | 00100101 | 00000100001000 | 101 | 01100101 | 00000000100010 |
| 38 | 00100110 | 01000000100000 | 102 | 01100110 | 01000000100010 |
| 39 | 00100111 | 00100100001000 | 103 | 01100111 | 00100100100010 |
| 40 | 00101000 | 01001001001000 | 104 | 01101000 | 01001001000010 |
| 41 | 00101001 | 10000001001000 | 105 | 01101001 | 10000001000010 |
| 42 | 00101010 | 10010001001000 | 106 | 01101010 | 10010001000010 |
| 43 | 00101011 | 10001001001000 | 107 | 01101011 | 10001001000010 |
| 44 | 00101100 | 01000001001000 | 108 | 01101100 | 01000001000010 |
| 45 | 00101101 | 00000001001000 | 109 | 01101101 | 00000001000010 |
| 46 | 00101110 | 00010001001000 | 110 | 01101110 | 00010001000010 |
| 47 | 00101111 | 00100001001000 | 111 | 01101111 | 00100001000010 |
| 48 | 00110000 | 00000100001000 | 112 | 01110000 | 10000000000010 |
| 49 | 00110001 | 10000010001000 | 113 | 01110001 | 10000010000010 |
| 50 | 00110010 | 10010010001000 | 114 | 01110010 | 10010010000010 |
| 51 | 00110011 | 00100010001000 | 115 | 01110011 | 00100000100010 |
| 52 | 00110100 | 01000010001000 | 116 | 01110100 | 01000010000010 |
| 53 | 00110101 | 00000010001000 | 117 | 01110101 | 00000010000010 |
| 54 | 00110110 | 00010010001000 | 118 | 01110110 | 00010010000010 |
| 55 | 00110111 | 00100010001000 | 119 | 01110111 | 00100010000010 |
| 56 | 00111000 | 01001000001000 | 120 | 01111000 | 01001000000010 |
| 57 | 00111001 | 10000000001000 | 121 | 01111001 | 00001001001000 |
| 58 | 00111010 | 10010000001000 | 122 | 01111010 | 10010000000010 |
| 59 | 00111011 | 10001000001000 | 123 | 01111011 | 10001000000010 |
| 60 | 00111100 | 01000000001000 | 124 | 01111100 | 01000000000010 |
| 61 | 00111101 | 00000000001000 | 125 | 01111101 | 00000000000010 |
| 62 | 00111110 | 00010000001000 | 126 | 01111110 | 00010000000010 |
| 63 | 00111111 | 00100000001000 | 127 | 01111111 | 00100000000010 | d1----d8
C1--------C14
C1 is first out.

EFM conversion table 0 - 127
(NRZ-I representation)

FIG.1/1 (PRIOR ART)

| data bits | channel bits | | data bits | channel bits |
|---|---|---|---|---|
| 128 | 10000000 | 01001000100001 | 192 | 11000000 | 01000100100000 |
| 129 | 10000001 | 10000100100001 | 193 | 11000001 | 10000100100001 |
| 130 | 10000010 | 10010000100001 | 194 | 11000010 | 10010010010000 |
| 131 | 10000011 | 10001000100001 | 195 | 11000011 | 00001000100100 |
| 132 | 10000100 | 01000100100001 | 196 | 11000100 | 01000100010001 |
| 133 | 10000101 | 00000100100001 | 197 | 11000101 | 00000100010001 |
| 134 | 10000110 | 00010000100001 | 198 | 11000110 | 00010010010000 |
| 135 | 10000111 | 00100100100001 | 199 | 11000111 | 00100100010001 |
| 136 | 10001000 | 01001001000001 | 200 | 11001000 | 00001001000001 |
| 137 | 10001001 | 10000001000001 | 201 | 11001001 | 10000100000001 |
| 138 | 10001010 | 10010001000001 | 202 | 11001010 | 00001001000100 |
| 139 | 10001011 | 10001001000001 | 203 | 11001011 | 00001001000000 |
| 140 | 10001100 | 01000001000001 | 204 | 11001100 | 01000100000001 |
| 141 | 10001101 | 00000001000001 | 205 | 11001101 | 00000100000001 |
| 142 | 10001110 | 00010001000001 | 206 | 11001110 | 00000010010000 |
| 143 | 10001111 | 00100001000001 | 207 | 11001111 | 00100100000001 |
| 144 | 10010000 | 10000001000001 | 208 | 11010000 | 00000100100100 |
| 145 | 10010001 | 10000010000001 | 209 | 11010001 | 10000010010001 |
| 146 | 10010010 | 10010010000001 | 210 | 11010010 | 10010010010001 |
| 147 | 10010011 | 00100000010001 | 211 | 11010011 | 10000100100000 |
| 148 | 10010100 | 01000010000001 | 212 | 11010100 | 01000010010001 |
| 149 | 10010101 | 00000010000001 | 213 | 11010101 | 00000010010001 |
| 150 | 10010110 | 00010010000001 | 214 | 11010110 | 00010010010001 |
| 151 | 10010111 | 00100010000001 | 215 | 11010111 | 00100010010001 |
| 152 | 10011000 | 01001000000001 | 216 | 11011000 | 01000100010001 |
| 153 | 10011001 | 10000010010000 | 217 | 11011001 | 10000000010001 |
| 154 | 10011010 | 10010000000001 | 218 | 11011010 | 10010000010001 |
| 155 | 10011011 | 10001000000001 | 219 | 11011011 | 10000100010001 |
| 156 | 10011100 | 01000010010000 | 220 | 11011100 | 01000000010001 |
| 157 | 10011101 | 00001000000001 | 221 | 11011101 | 00000100010001 |
| 158 | 10011110 | 00010000000001 | 222 | 11011110 | 00010000010001 |
| 159 | 10011111 | 00100010010000 | 223 | 11011111 | 00100100010001 |
| 160 | 10100000 | 00001000100001 | 224 | 11100000 | 01000100000010 |
| 161 | 10100001 | 10000100001001 | 225 | 11100001 | 00000100000010 |
| 162 | 10100010 | 01000100010000 | 226 | 11100010 | 10000100000010 |
| 163 | 10100011 | 00000100010000 | 227 | 11100011 | 00100100000010 |
| 164 | 10100100 | 01000100001001 | 228 | 11100100 | 01000100010010 |
| 165 | 10100101 | 00000100001001 | 229 | 11100101 | 00000100000010 |
| 166 | 10100110 | 01000100100001 | 230 | 11100110 | 01000100100010 |
| 167 | 10100111 | 00100100001001 | 231 | 11100111 | 00100100010010 |
| 168 | 10101000 | 01001001001001 | 232 | 11101000 | 10000000000010 |
| 169 | 10101001 | 10000001001001 | 233 | 11101001 | 10000010000010 |
| 170 | 10101010 | 10010001001001 | 234 | 11101010 | 00001001001001 |
| 171 | 10101011 | 10001001001001 | 235 | 11101011 | 00001001000010 |
| 172 | 10101100 | 01000001001001 | 236 | 11101100 | 01000000000010 |
| 173 | 10101101 | 00000001001001 | 237 | 11101101 | 00000100000100 |
| 174 | 10101110 | 00010001001001 | 238 | 11101110 | 00010000000100 |
| 175 | 10101111 | 00100001001001 | 239 | 11101111 | 00100100000100 |
| 176 | 10110000 | 00001000100000 | 240 | 11110000 | 00000100100010 |
| 177 | 10110001 | 10000010001001 | 241 | 11110001 | 10000010010010 |
| 178 | 10110010 | 10010010001001 | 242 | 11110010 | 10010010010010 |
| 179 | 10110011 | 00100100010000 | 243 | 11110011 | 00001000100010 |
| 180 | 10110100 | 01000010001001 | 244 | 11110100 | 01000010010010 |
| 181 | 10110101 | 00000010001001 | 245 | 11110101 | 00000010010010 |
| 182 | 10110110 | 00010010001001 | 246 | 11110110 | 00010010010010 |
| 183 | 10110111 | 00100010001001 | 247 | 11110111 | 00100100010010 |
| 184 | 10111000 | 01001000001001 | 248 | 11111000 | 01000100010010 |
| 185 | 10111001 | 10000000001001 | 249 | 11111001 | 10000000010010 |
| 186 | 10111010 | 10010000001001 | 250 | 11111010 | 10010000010010 |
| 187 | 10111011 | 10001000001001 | 251 | 11111011 | 10000100010010 |
| 188 | 10111100 | 01000000001001 | 252 | 11111100 | 01000000010010 |
| 189 | 10111101 | 00001000001001 | 253 | 11111101 | 00000100010010 |
| 190 | 10111110 | 00010000001001 | 254 | 11111110 | 00010000010010 |
| 191 | 10111111 | 00100000001001 | 255 | 11111111 | 00100000010010 | d1----d8  C1--------C14

EFM conversion table 128 - 255
(NRZ-I presentation)

FIG.1/2 (PRIOR ART)

| | Product term input bits | | | | | | | | | | | | | | Active Outputs | | | | | | | | |
|---|---|---|---|---|---|---|---|---|---|---|---|---|---|---|---|---|---|---|---|---|---|---|---|
| | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $X_1$ | $X_2$ | $X_3$ | $X_4$ | $X_5$ | $X_6$ | $X_7$ | $X_8$ | $X_9$ |
| 0 | | | | | | | | | | | 1 | 1 | | 0 | | A | A | | | | | | |
| 1 | | | | | | | | | | 0 | | 1 | 1 | | | A | A | | | | | | |
| 2 | | | | | | | | | | 0 | 0 | | | 1 | A | A | | | | | | | |
| 3 | | | | | | | | | | | | | | | | | | | | | | | |
| 4 | | | | | | | | | | | 1 | | | 1 | A | | A | | | | | | |
| 5 | | | | | | | | | | 1 | | | | 1 | A | A | | | | | | | |
| 6 | | | | | | | | | | 1 | | | 1 | | A | A | A | | | | | | |
| 7 | | 1 | | | 0 | | | | | | | | | | | | | | | | | A | |
| 8 | | | 1 | | | | | | | | | | | | | | | | | | A | A | |
| 9 | 0 | | | 1 | | | | | | | | | | | | | | | | | | A | A |
| 10 | 1 | | | 0 | 0 | | | | | | | | | | | | | | | A | A | | |
| 11 | | 1 | | | 1 | | | | | | | | | | | | | | | | A | A | A |
| 12 | 1 | | | 1 | | | | | | | | | | | | | | | | A | A | A | |
| 13 | 1 | | | 1 | | | | | | | | | | | | | | | | A | A | A | |
| 14 | | | | | 1 | | | | | | | | | | | | | A | A | | | | |
| 15 | | | | | | 1 | | | | | | | | | | | | | A | | | | |
| 16 | | | | | 0 | 0 | 0 | 0 | | | | | | | | | A | A | | | | | |
| 17 | 1 | | | 0 | 0 | 0 | | 1 | | | | | | | | | A | A | | A | | | |
| 18 | | | 1 | | | 0 | | 1 | 1 | | | | | | | | A | | A | | | | |
| 19 | | | | | | 1 | | | 0 | 0 | 0 | | | 1 | | A | | A | | | | | |
| 20 | | | | | 1 | | | 0 | | 1 | | | | | A | | A | A | | | | | |
| 21 | | | 0 | | | 1 | | | 1 | 0 | | 0 | 0 | | A | | | A | | | | | |
| 22 | | | | | 1 | | | 0 | 0 | | | 1 | | | A | | | | A | | | | |
| 23 | | 1 | | | 0 | 0 | | | 1 | | | | | | | A | | | A | | | | |
| 24 | 0 | 0 | 0 | | 1 | | | 1 | | | | 1 | | | A | | A | | A | | A | | |
| 25 | 0 | 0 | | | 1 | | | 1 | | | | 1 | | | A | | A | A | A | | | | |
| 26 | 0 | | 1 | | 0 | 0 | | 1 | | | | 1 | | | A | | | | A | | | | |
| 27 | | 1 | | | 0 | 0 | | 1 | | | | 1 | | | A | | | | | | | | |
| 28 | 0 | 0 | | | 1 | | 1 | | | | | 1 | | | A | | | A | A | | A | | |
| 29 | 0 | 0 | | | 1 | 1 | | | 0 | | | 1 | | | A | | | A | | A | | | |
| 30 | 0 | 0 | | | 1 | 1 | | | 1 | | | 1 | | | A | | | A | A | A | | | |
| 31 | 1 | | | | 1 | | | | 1 | | | 1 | | | | | | A | A | A | | | |
| 32 | 1 | | | | 1 | | 1 | 0 | 0 | | | 1 | | | | A | | A | | A | | | |
| 33 | 0 | 0 | | | 1 | | 1 | | 1 | 1 | | 0 | | | A | | A | A | | | | | |
| 34 | 0 | 0 | | | 1 | 1 | | | | 1 | | | | | A | | | | A | A | A | | |
| 35 | 0 | 0 | | | 1 | | | | 1 | | | 1 | | | | A | | A | A | | | | |
| 36 | 0 | 0 | 0 | | 1 | | 1 | | 1 | | | 1 | | | A | | A | | A | A | | | |
| 37 | 0 | 0 | | | 1 | 1 | | | 1 | 1 | | | | | A | | | A | A | A | | | |
| 38 | 0 | 0 | | 0 | 1 | 1 | | | 1 | 1 | | | | | A | | | A | A | A | A | | |
| 39 | 0 | 0 | | | 1 | | 1 | | | 0 | 0 | 0 | | 0 | A | A | A | A | A | | | | |
| 40 | 1 | | | | 1 | | | 1 | | 1 | 0 | 0 | | | | A | A | | A | | | | |
| 41 | 1 | | | | 1 | | | 1 | | | 0 | 0 | 0 | | A | A | | A | | A | | | |
| 42 | | | 1 | | 1 | | | | 1 | | 0 | | 0 | | A | | A | A | | | | | |
| 43 | | 1 | | | 1 | | 1 | | | 1 | | 0 | 0 | | A | | A | A | A | | | | |
| 44 | | 1 | | | 1 | | | | 1 | | 0 | 0 | 0 | | A | | A | | A | A | | | |
| 45 | 1 | | | | 1 | | | | 1 | | 0 | 0 | 0 | | A | A | | | A | | | | |
| 46 | 0 | 0 | 0 | 0 | 0 | 0 | | 1 | 1 | | 0 | 0 | 0 | | | | | A | A | | A | | |
| 47 | 0 | 0 | | 0 | | 1 | | | 1 | | 0 | 0 | 0 | | A | | | A | A | | A | A | |
| 48 | 0 | 0 | | | 1 | | | 1 | | | 0 | 0 | 0 | | | A | | | A | A | A | | |
| 49 | 0 | 0 | 0 | | 1 | | 0 | 0 | 0 | | 0 | 0 | | | | A | A | | A | A | | | |
| 50 | | | | 1 | | | 1 | | 1 | | | 0 | 0 | | A | A | | | | | | | A |
| 51 | 0 | 0 | 0 | 0 | | | 1 | | 1 | | | 0 | 0 | | A | | | | | A | A | A | |

FIG.2B

(PRIOR ART)

Logic array product term      (for NRZ-I signal)
0 = inverse input bit is in product term
1 = input bit is in product term
A = output is active high for a particular product term

METHOD AND SYSTEM FOR IMPROVED ERROR CORRECTION IN OPTICAL MEDIA DATA PROCESSING

FIELD OF THE INVENTION

The present invention relates to optical media, and more particularly to error correction in optical media data processing.

BACKGROUND OF THE INVENTION

Data formats for optical drives and media are well known in the art. According to the standard of the industry, set forth in what is commonly referred to as the "Red Book", data for optical drives are in a 8 bit format, while the data stored on the optical media are in a 14 bit format. Thus, when data is to be written onto an optical media, it is first modulated from the 8 bit format to the 14 bit format. This modulation process is commonly referred to as "EFM" or Eight to Fourteen Modulation. Conversely, when data is retrieved from an optical media, it must first be demodulated from the 14 bit format to the 8 bit format before the data may be further processed.

Two conventional demodulation processes are provided by the Red Book. The first conventional process is to use an EFM conversion table. FIG. 1 illustrates the standard EFM conversion table. With this first process, the 14 bit data (C1–C14) is mapped into an 8 bit data (d1–d8) according to the EFM conversion table. However, errors may occur in the mapping. For example, since the 14 bit format provides more combinations of 1's and 0's than the 8 bit format, an error occurs when a 14 bit data does not have a corresponding 8 bit data in the EFM conversion table or when a wrong entry due to a violation of the run length (RLL) requirement. These errors may be found and corrected by the Error Correction Code (ECC). The ECC uses information encoded during the C1 and C2 encoding processes to find and correct errors. The C1 and C2 encoding processes are performed prior to the writing of the data onto the optical media. In the C1 encoding process, additional bytes are encoded containing information about the data. In the C2 encoding process, additional bytes are encoded into the C1 encoded data, and the frames of the C2 encoded data are interleaved with an appropriate time delay.

After the demodulation process, if one error only is found, then this error is correctable using during the C1 correction process. Mathematically, the C1 encoded data can only guarantee the correction of one error.

The second conventional process is to use a logic array to convert the data from the 14 bit format to the 8 bit format. FIG. 2A illustrates a conventional demodulator 250 with the logic array 252. $C_i$ is the input data in the 14 bit format. $D_i$ is the output data in the 8 bit format. FIG. 2B shows the product term input bits and the corresponding active outputs for the logic array 252. This is process, all data is processed through the logic array 252. When there is an error, a "best guess" value results from the logic array 252. However, there is no awareness that the error occurred. Thus, no further data correction can be implemented. This process also limits the integrity of the read data.

Accordingly, there exists a need for an improved method and system for error correction in optical media data processing. The improved method and system should be easy to implement and increase the integrity of the read data. The present invention addresses such a need.

SUMMARY OF THE INVENTION

The present invention provides a method and system for error correction in optical media data processing. The method includes demodulating a data using a conversion table; marking errors which occur during the demodulation; utilizing estimated values for the marked errors; and performing error correction. The method and system marks errors which occur during demodulation. A logic array is used to obtain estimated values for the marked errors. The marking of errors and the use of values from the logic array for the marked errors increases the probability of the C1 and C2 correction processes being able to correct the errors. Fewer "not correctable" data results. This increases the integrity of the read data.

BRIEF DESCRIPTION OF THE FIGURES

FIG. 1 illustrates the standard EFM conversion table.

FIG. 2B shows the product term input bits and the corresponding active outputs for the logic array 252.

DETAILED DESCRIPTION

The present invention provides an improved method and system for error correction in optical media data processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 and 4 in conjunction with the discussion below.

Figure 3:
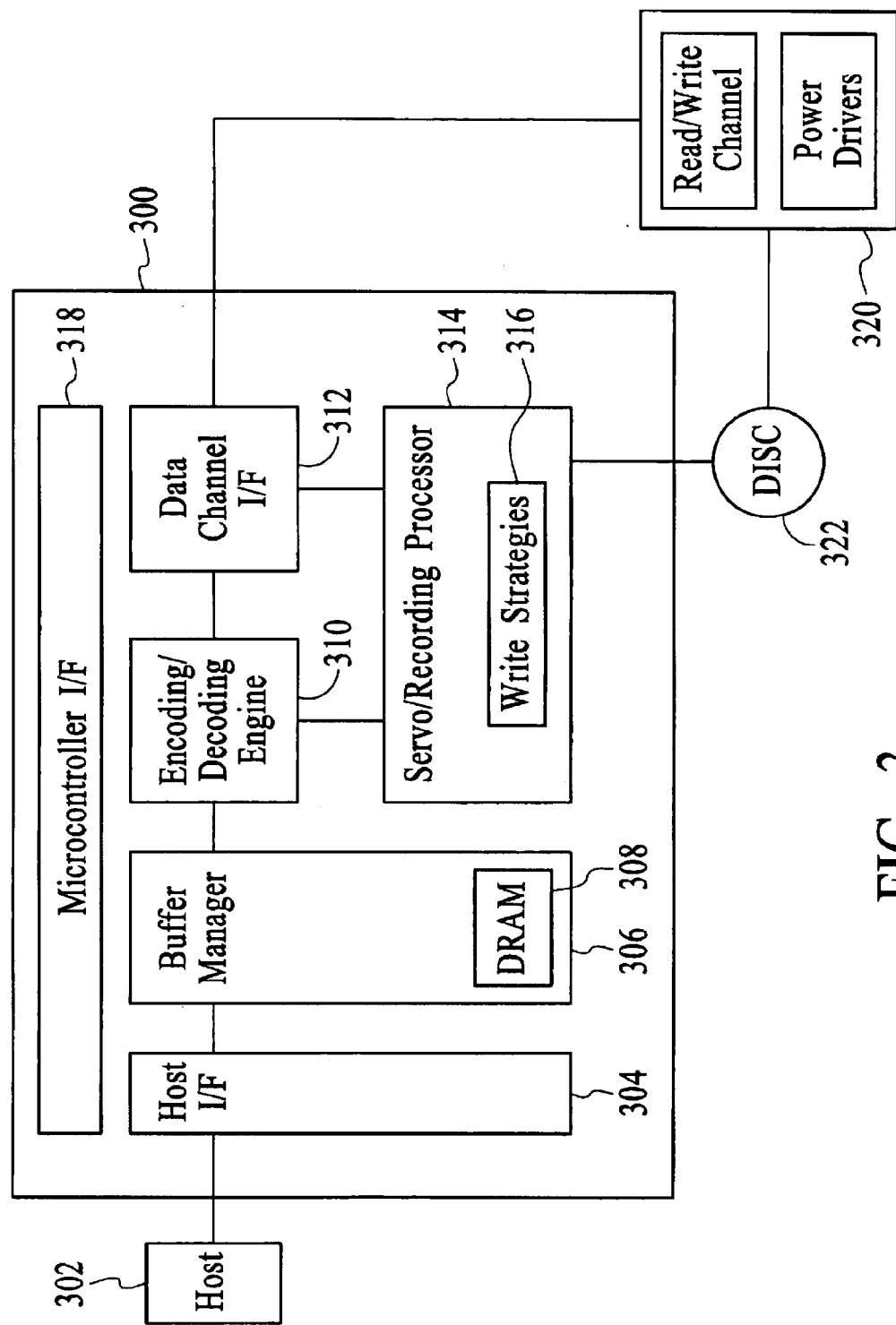
FIG. 3 is a block diagram illustrating a preferred embodiment of a controller which may use the method and system in accordance with the present invention.

FIG. 3 is a block diagram illustrating a preferred embodiment of a controller which may use the method and system in accordance with the present invention. The elements 304–318 represent the logical architecture of the controller 300. The controller 300 comprises a host interface 304, a buffer manager 306 with an embedded memory 308, an integrated encoding/decoding engine 310, a data channel interface 312, an integrated servo/recording processor 314 embedded with the write strategies 316, and a microcontroller interface 318. In the preferred embodiment, the embedded memory 308 is an embedded dynamic random access memory (DRAM). The integrated servo/recording processor 314 provides the mechanical control of the disc 320 and the spindle and sledge (not shown) of the drive for both reading and writing of data. Integrated into the processor 314 are the write strategies 316 which controls the writing of the data so that the data is in a standard format. The write control logic in accordance with the present invention would be part of the servo/recording processor 314 for controller 300. The controller 300 is further described in co-pending U.S. patent application entitled "Integrated Controller to Process Both Optical Reads and Optical Writes of Multiple Optical Media", Ser. No. 09/652,254, filed on Aug. 30, 2000. Applicant hereby incorporates this patent application by reference.

Although the method and system in accordance with the present invention will be described in the context of the controller illustrated in FIG. 3, other controllers may use the method and system without departing from the spirit and scope of the present invention.

Figure 2A:
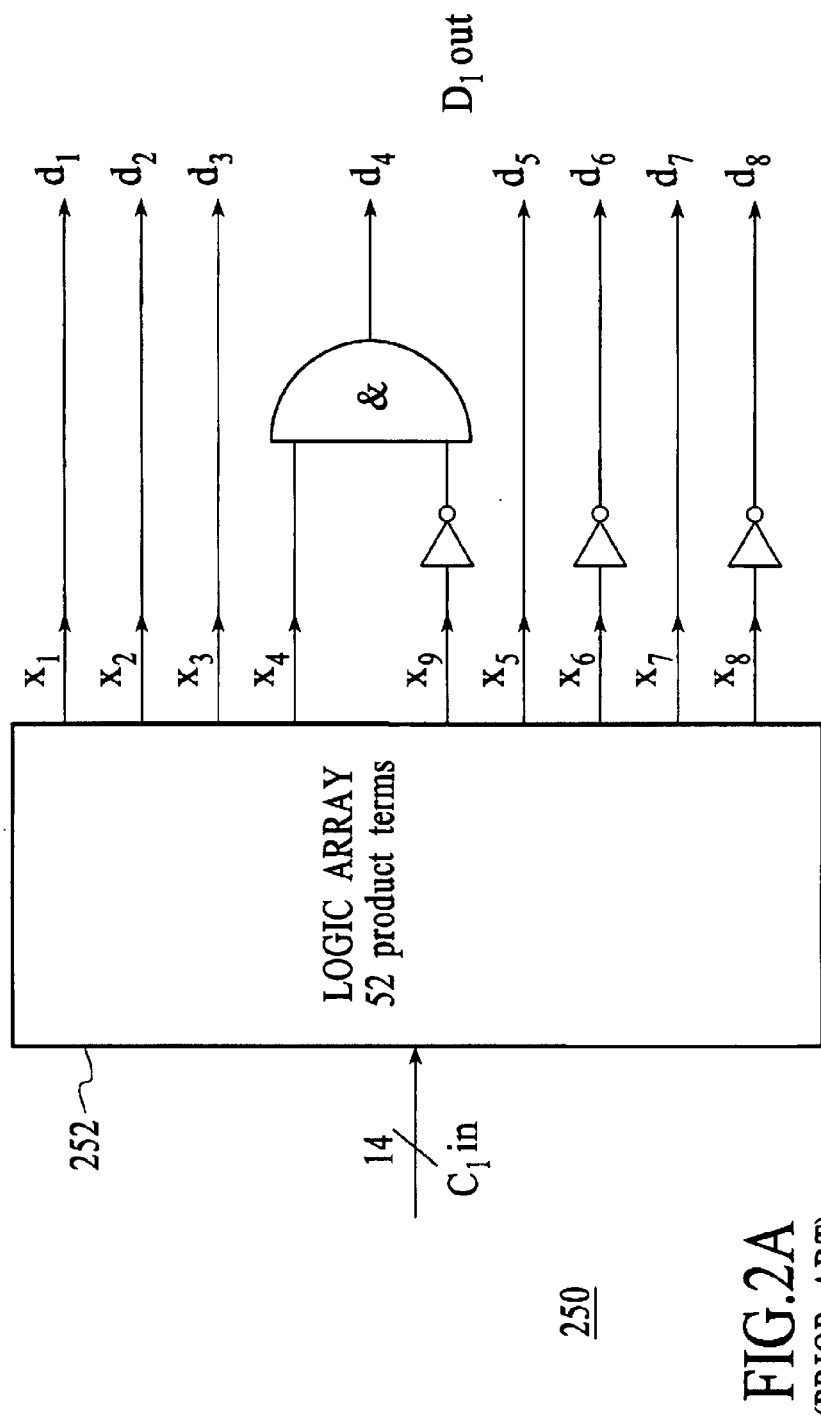
FIG. 2A illustrates a conventional demodulator with the logic array.
Figure 4:
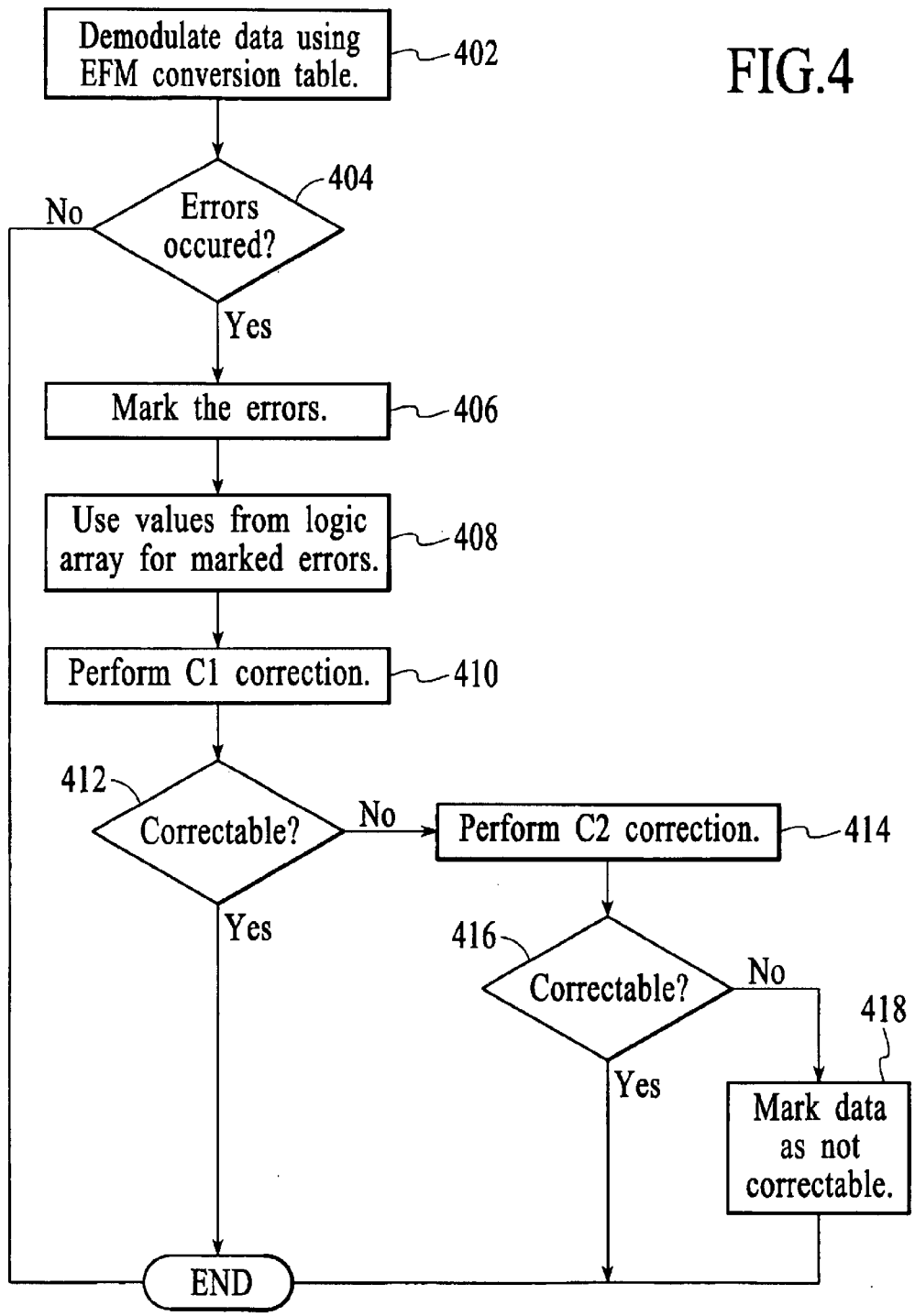
FIG. 4 is a flow chart illustrating a preferred embodiment of a method for error correction in accordance with the present invention.

FIG. 4 is a flow chart illustrating a preferred embodiment of a method for error correction in accordance with the present invention. In the preferred embodiment, the method is implemented in hardware are part of the integrated encoding/decoding engine 310. However, the method may also be implemented in software, or as part of a different controller, without departing from the spirit and scope of the present invention. First, the data is demodulated using the EFM conversion table, via step 402. Next, if errors occurred in the demodulation, via 404, the errors are marked, via step 406. For example, an error occurs when the 14 bit data has no corresponding 8 bit data in the conversion table. A logic array, such as one illustrated in FIG. 2A, is then used to obtain "best guess" or estimated values for the marked errors, via step 408. Error correction is then performed, via steps 410–418. In the preferred embodiment, the error correction includes the C1 and C2 correction processes. The C1 correction process is first performed, via step 410. If the C1 correction process is not able to correct the data, i.e., there is more than one error, via step 412, then the C2 correction process is performed on the data, via step 414. If the C2 correction process is not able to correct the data, i.e., there is more than two errors, then the data is marked as not correctable, via step 418.

For example, assume that in the demodulation, via step 402, one error occurs. This error is marked, via step 406. The logic array is then used to obtain a "best guess" value for this error, via step 408. The C1 correction process is then performed, via step 410. If the "best guess" value is correct, then it finds no errors. If it is not correct, then the C1 correction process is able to guarantee the correction of this one error. The error is thus determined to be correctable, via step 412.

For another example, assume that in the demodulation, via step 402, two errors occur. These errors are marked, via step 406. The logic array is then used to obtain "best guess" values for these two errors, via step 408. Assume that one of the "best guess" values is correct while the other is not. This leaves one error. When the C1 correction process is performed, via step 410, the C1 encoded data is able to guarantee the correction of the one remaining error. If neither of the "best guess" values are correct, then the data is determined to not be correctable by the C1 correction process, via step 412, and the C2 correction process is then performed, via step 414. Since the C2 encoded data is able to guarantee the correction of the two errors, the data is correctable.

For a third example, assume that in the demodulation, via step 402, three errors occur. These three errors are marked, via step 406. The logic array is used to obtain "best guess" values for these three errors, via step 408. If all three of the "best guess" values are correct, then when the C1 correction process is performed, via step 410, no errors are found. If only two of the "best guess" values are correct, then there is one remaining error. The C1 correction process is then performed, via step 410, and is able to correct the remaining error. The data is thus correctable. If only one of the "best guess" values is correct, then there are two remaining errors. The data is determined to not be correctable by the C1 correction process, via step 412. The C2 correction process is thus performed, via step 414. Since there are only two errors, the data is correctable by the C2 correction process, via step 416. If none of the "best guess" values are correct, then there are three errors, which is too many for the C2 correction process to correct. The data is then marked as not correctable, via step 418.

An improved method and system for error correction in optical media data processing has been disclosed. The method and system marks errors which occur during demodulation. A logic array is used to obtain values for the marked errors. The marking of errors and the use of values from the logic array for the marked errors increases the probability of the C1 correction process and the C2 correction process being able to correct the errors. Fewer "not correctable" data results. This increases the integrity of the read data.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for error correction in optical media data processing, comprising the sequential steps of:

(a) demodulating a data using a conversion table;

(b) marking errors which occur during the demodulation;

(c) utilizing estimated values for the marked errors, wherein the estimated values are obtained from a logic array; and (d) performing error correction.

2. The method of claim 1, wherein the demodulating step (a) is performing utilizing an Eight to Fourteen (EFM) conversion table.

3. The method of claim 1, wherein the performing step (d) comprises:

(d1) performing a C1 correction process;

(d2) determining if the C1 correction process is able to correct the errors; and (d3) performing a C2 correction process if the C1 correction process is not able to correct the errors.

4. The method of claim 3, further comprising:

(d4) determining if the C2 correction process is able to correct the errors; and (d5) marking the data as not correctable if the C2 correction process is not able to correct the errors.

5. A method for error correction in optical media data processing, comprising the sequential steps of:

(a) demodulating a data using a conversion table;

(b) marking errors which occur during the demodulation;

(c) utilizing estimated values for the marked errors, wherein the estimated values are obtained from a logic array;

(d) performing a C1 correction process;

(e) determining if the C1 correction process is able to correct the errors; and (f) performing a C2 correction process if the C1 correction process is not able to correct the errors.

6. The method of claim 5, wherein the demodulating step (a) is performing utilizing an Eight to Fourteen (EFM) conversion table.

7. A method for error correction in optical media data processing, comprising the sequential steps of:

(a) demodulating a data using a conversion table;

(b) marking errors which occur during the demodulation;

(c) utilizing estimated values from a logic array for the marked errors, wherein the estimated values are obtained from a logic array;

(d) performing a C1 correction process;

(e) determining if the C1 correction process is able to correct the errors;
(f) performing a C2 correction process if the C1 correction process is not able to correct the errors;
(g) determining if the C2 correction process is able to correct the errors; and
(h) marking the data as not correctable if the C2 correction process is not able to correct the errors.

8. An optical drive controller, comprising:
means for receiving a data read from an optical media;
means for demodulating the data using a conversion table;
means for marking errors which occur during the demodulation;
means for utilizing estimated values for the marked errors, wherein the estimated values are obtained from a logic array; and
means for performing error correction.

9. The controller of claim 8, wherein the receiving means comprises a data channel interface.

10. The controller of claim 8, wherein the demodulating means comprises an EFM conversion table.

* * * * *